United States Patent [19]
Gajski

[11] 4,190,893
[45] Feb. 26, 1980

[54] MODULAR MODULO 3 MODULE

[75] Inventor: Daniel D. Gajski, Campaign, Ill.

[73] Assignee: Burroughs Corporation, Detroit, Mich.

[21] Appl. No.: 852,445

[22] Filed: Nov. 17, 1977

[51] Int. Cl.² ............................ G06F 7/48; G06F 7/50
[52] U.S. Cl. .................................................... 364/746
[58] Field of Search ............................... 364/746, 739; 340/347 DD

[56] References Cited

U.S. PATENT DOCUMENTS

| | | | |
|---|---|---|---|
| 3,609,324 | 9/1971 | Kieburtz | 364/746 |
| 3,980,874 | 9/1976 | Vora | 364/746 |

OTHER PUBLICATIONS

Goldschmidt et al. "Modulo-3 Residue Tree" *IBM Tech. Disclosure Bulletin*, vol. 8 No. 1 Jun. '65 pp. 29-31.
Clapper "Determination of a Module-3 Residue" *IBM Tech. Disclosure Bulletin*, vol. 12 No. 7 Dec.'69 pp. 953-954.
Banerji et al. "On Translation Algorithms in Residue No. Systems" *IEEE Trans. on Computers*, vol. C-21 No. 12 Dec.'72 pp. 1281-1285.
Weinberger "Modulo-3 Residue Trees" *IBM Tech. Disclosure Bulletin*, vol. 19 No. 7 Dec.'76 pp. 2657-2662.

*Primary Examiner*—David H. Malzahn
*Attorney, Agent, or Firm*—Edward J. Feeney, Jr.; Edmund M. Chung; Leonard C. Brenner

[57] ABSTRACT

A modular modulo 3 module is provided having a plurality of input terminals for receiving in parallel two bytes of numerical data, and a plurality of output terminals for outputting the modulo 3 residue of each byte of data individually and the modulo 3 residue of the sum of the input bytes. The modulo 3 module is implemented through a plurality of first type modules which combine logically the numerical data on individual pairs of inputs and feed in turn a logrithmic array of second type modules which combine logically to generate the modulo 3 outputs.

1 Claim, 7 Drawing Figures $Y_1 = X_1 \overline{X}_0$
$Y_0 = \overline{X}_1 X_0$ $Y_1 = X_2 X_0 + \bar{X}_3 \bar{X}_2 X_1 + X_3 \bar{X}_1 \bar{X}_0$ $Y_0 = \bar{X}_3 \bar{X}_2 X_0 + X_2 \bar{X}_1 \bar{X}_0 + X_3 X_1$

MODULAR MODULO 3 MODULE

CROSS REFERENCE TO RELATED APPLICATION

In copending application Ser. No. 810,186, now abandoned, for "High Speed Modulo 3 Generator Module", filed June 27, 1977 in the name of Chandrakant R. Vora, and assigned to the assignee of the present invention, there are described and claimed several embodiments of modulo 3 generator modules combined in modular fashion for binary and binary coded decimal applications. Although not limited thereto, the present modular modulo 3 module invention may be utilized in such combinations disclosed therein.

BACKGROUND OF THE INVENTION

Modulo 3 generation finds application in the field of arithmetic error codes utilization and more particularly in the area of residue code generation. An arithmetic error code is a redundant representation of numbers having the property that certain errors can be detected or corrected in arithmetic operations. A residue code is a separate arithmetic code, in which the information to be used in checking, called check code, is attached to the representation of the number; that is, the number and its check code are processed separately. The check code is attached to the number, say N, is the residue modulo m of that number; that is, the remainder in the division of N by m.

Mathematically speaking, every number N can be represented as a set of two numbers, called codeword $<N, rm(N)>$, where N is any integer, and $rm(N)$ is the remainder of $N/m$. Addition and multiplication of N1 and N2 are defined as follows:

$$<N1, rm(N1)> + <N2, rm(N2)> = <N1+N2, rm(N1) \boxplus rm(N2)> \quad (1)$$

and $$<N1, rm(N1)> \cdot <N2, rm(N2)> = <N1 \cdot N2, rm(N1) \boxdot rm(N2)> \quad (2)$$

where $\boxplus$ and $\boxdot$ are addition and multiplication modulo m. Furthermore, if the equations $$rm(N1+N2) = rm(N1) \boxplus rm(N2) \quad (3)$$

and $$rm(N1 \cdot N2) = rm(N1) \boxdot rm(N2) \quad (4)$$

are satisfied, then the sum or product of any two code words yields another codeword. This property is called code closure under addition and multiplication respectively. The error checking circuit simply checks whether the sum or product is another code word.

Consider a k-bit binary number N, wherein $$N = n_{k-1} n_{k-2} \ldots n_1 n_0 = \sum_{i=0}^{k-1} n_i 2^i.$$

Using Equations (3) and (4), we can find modulus of N $$r_m(N) = \sum_{i=0}^{k-1} r_m(n_i) \boxdot r_m(2^i)$$

where $\boxed{\Sigma}$ is modulo-sum symbol. Note that for all $n_i \in \{0, 1\}$, $r_m(n_i) = n_i$, if $m > 1$ and $n_i \boxdot k = n_i \cdot k$. Therefore, $$r_m(N) = \sum_{i=0}^{k-1} n_i \cdot r_m(2^i)$$

Furthermore, using (4) for all integers i, $i \geq 0$ $$r_3(2^{2i}) = r_3((2^2)^i) = \prod_{k=0}^{k=i-1} r_3(2^2) = 1$$

$$r_3(2^{2i+1}) = r_3(2^{2i}) \boxdot r_3(2) = 1 \boxdot 2 = 2$$

Thus, modulo 3 of a number can be performed by adding number of 1's and 2's in modulo 3 fashion. Therefore, modulo three is suitable for use in arithmetic error code applications.

In a high speed data processing system it is important that the residue checking operation be performed quickly so as not to incur a delay in the overall arithmetic operation. One high speed method of modulo generation involves the use of read-only memories (ROM's) wherein a ROM is "addressed" by a number and the desired modulo of that number is read out therefrom, see for example U.S. Pat. No. 3,980,874 issued Sept. 14, 1976 for "BINARY TO MODULO M TRANSLATION". However, the cost of ROM implementation for modulo translation can become rather excessive particularly for modulo translation of very large numbers. Another alternative is to design a particular modulo generator for each particular applicaion. However, the inflexability of this approach renders it less than desirable for many applications. The need exists for an inexpensive, reliable, flexible modulo generator, particularly a modulo 3 generator for residue code generation.

OBJECTS AND SUMMARY OF THE INVENTION

It is therefore an object of the present invention to provide an modularly reliable modulo 3 module.

It is another object of the invention to provide a modular modulo 3 module which may be combined with other like modules for a variety of modulo 3 generating applications.

It is yet another object of the invention to provide a modular modulo 3 module suitable for high speed current mode logic integration techniques.

The above and other objects of the invention are realized through a modular modulo 3 module having inputs for accepting in parallel two bytes of numerical input data and a plurality of outputs for providing the modulo 3 generation of each byte of input data independently and the modulo 3 generation of the sum of the input bytes. A plurality of first type modules combine logically pairs of inputs and feed in turn a logrithmic array of second type modules which combine logically to generate the modulo 3 outputs.

The system configuration and operational details given above have been presented in simplified form. Other features of the invention will become more fully apparent in the drawings and detailed description presented hereinafter.

BRIEF DESCRIPTION OF THE DRAWINGS

FIG. 2 comprising FIG. 2A and FIG. 2B is a partial truth table for the module of FIG. 1;

DETAILED DESCRIPTION OF THE PREFERRED EMBODIMENT

Figures 1, 2A:
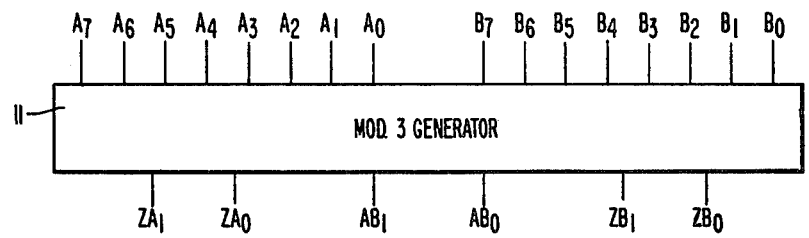
FIG. 1 is a block diagram of the modular modulo 3 module of the present invention.

The modulo 3 generator module 11 of the present invention is fabricated in the preferred embodiment, in a single integrated circuit package, see FIG. 1. Two eight bit bytes are provided as inputs; byte A comprising inputs $A_0$ through $A_7$ and byte B comprising inputs $B_0$ through $B_7$. Six outputs are provided in three two-bit pairs; ZA comprising $ZA_0$ and $ZA_1$, ZB comprising $ZB_0$ and $ZB_1$ and AB comprising $AB_0$ and $AB_1$. The outputs are described as follows:

ZA = A mod 3
ZB = B mod 3
AB = A + B mod 3

Thus, the logic levels appearing at the outputs ZA, ZB, AB are defined as modulo 3 functions of the logic levels presented to the inputs A and B, see partial truth table formatted in FIGS. 2A and 2B.

Figure 3:
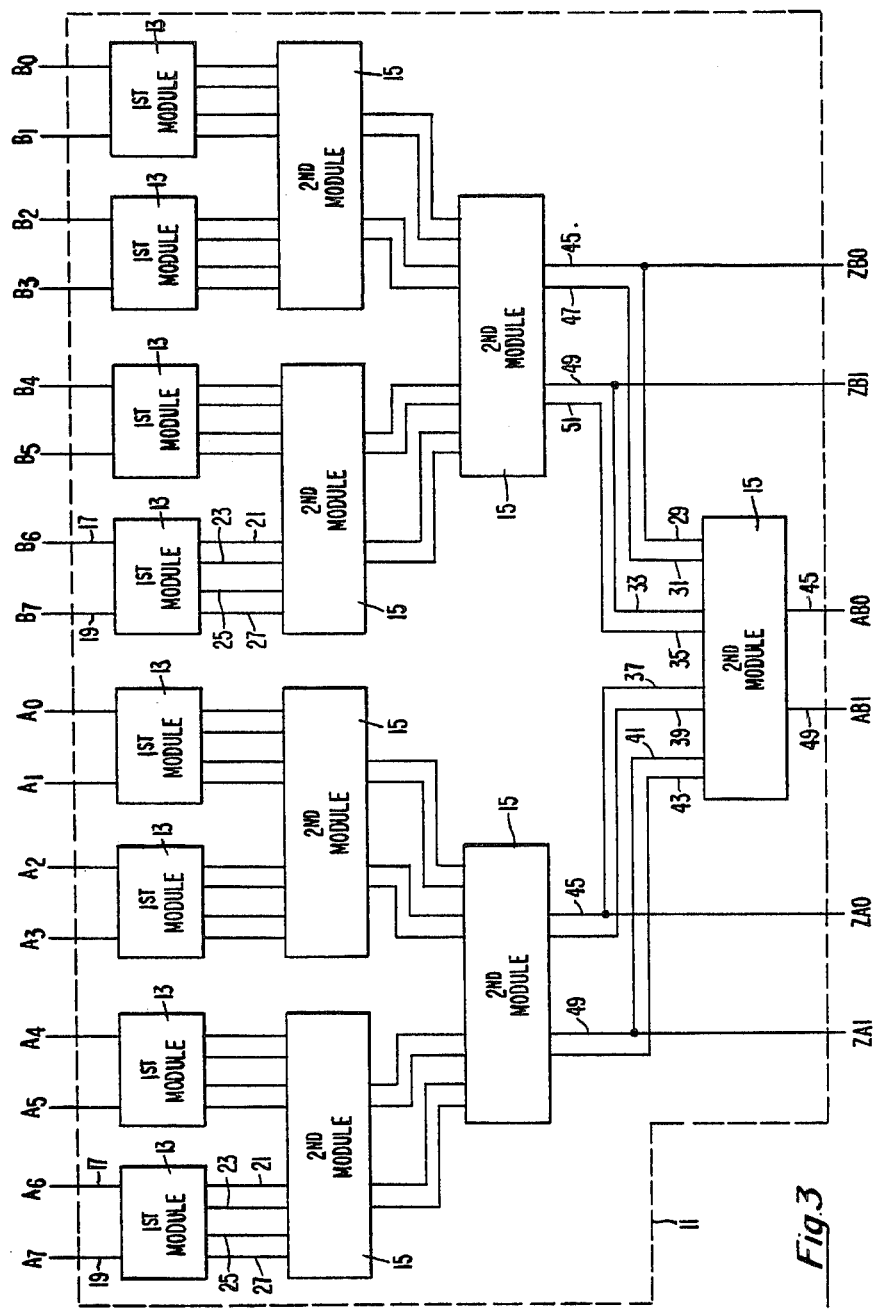
FIG. 3 is a detailed block diagram depicting the use of a first type and a second type module to implement the modular modulo 3 module of FIG. 1.

Further, the modulo 3 generator 11 of the present invention comprises a plurality of first modules 13 followed by a logrithmic array of second modules 15, see FIG. 3. Each first module 13 includes a first input 17, and a second input 19, and a first through fourth outputs 21, 23, 25 and 27 respectively. Each second module 15 includes a first through eighth input 29, 31, 33, 35, 37, 39, 41 and 43 respectively, and a first through fourth output terminal 45, 47, 49 and 51 respectively.

Figure 4:
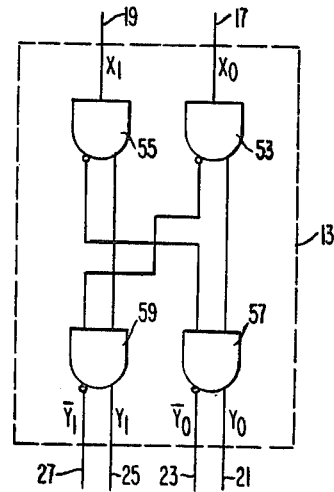
FIG. 4 is a logic diagram of the first type module shown in FIG. 3.

Each first module 13 is fabricated so that when the first input 17 receives a binary variable $X_0$ and the second input 19 receives a binary variable $X_1$, the first output 21 outputs a binary variable $Y_0$ wherein $Y_0 = X_1 X_0$, the second output 23 outputs $\overline{Y_0}$, the third output 25 outputs $Y_1$ wherein $Y_1 = X_1 \overline{X_0}$ and the fourth output 27 outputs $\overline{Y_1}$. Each first module is fabricated in the preferred embodiment from four logic gates 53, 55, 57, and 59, see FIG. 4.

Each second module 15 is fabricated so that when the first through eighth inputs 29, 31, 33, 35, 37, 39, 41 and 43 recieves respectively binary variables $X_0$, $\overline{X_0}$, $X_1$, $\overline{X_1}$, $X_2$, $\overline{X_2}$, $X_3$, and $\overline{X_3}$, the first through fourth outputs 45, 47, 49 and 51 output respectively $Y_0$, $\overline{Y_0}$, $Y_1$ and $\overline{Y_1}$ wherein:

$$Y_1 = X_2 X_0 + \overline{X_3} \overline{X_2} X_1 + X_3 \overline{X_1} \overline{X_0}$$

$$Y_0 = \overline{X_3} \overline{X_2} X_0 + X_2 \overline{X_1} \overline{X_0} + X_3 X_1$$

Figure 5:
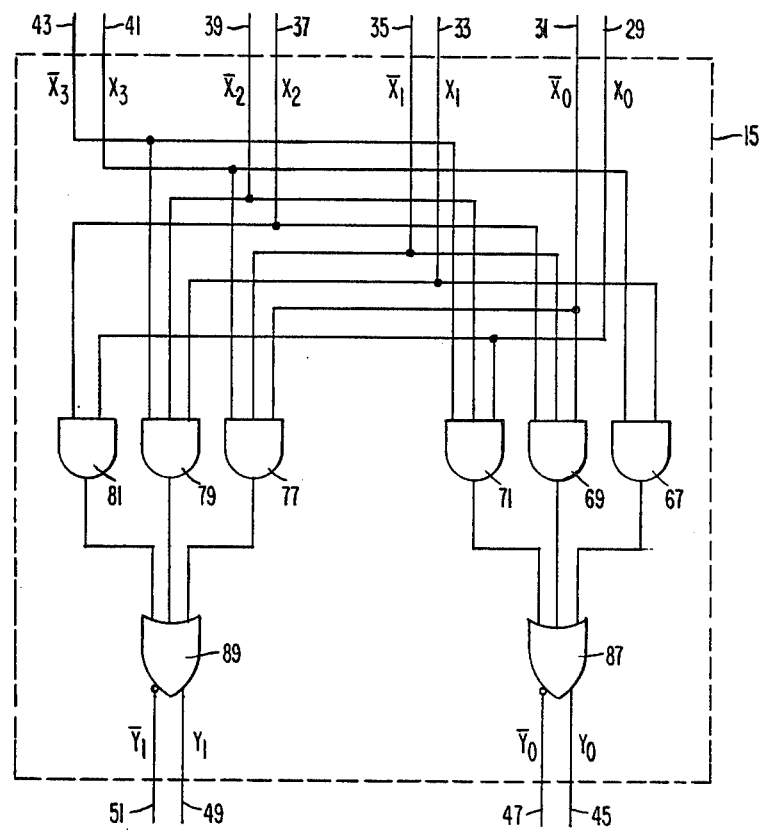
FIG. 5 is a logic diagram of the second type module shown in FIG. 3.

Each second module 15 is fabricated in the preferred embodiment from six AND type logic gates 67, 69, 71, 77, 79 and 81, and two OR type logic gates 87 and 89, see FIG. 5.

With reference again to FIG. 3, a complete modulo 3 generator 11 is constructed from a plurality of first modules 13 followed by a logrithmic array of second modules 15. Since each first module 13 has two levels of gates and each second module 15 has two levels of gates, it is appreciated that only six (or eight) levels of gates interpose the inputs and outputs of the modulo 3 generator of FIG. 3. It is appreciated that the modulo 3 generator 11 as shown and described is modular in form in that it may be used in combination with other like modules to provide modulo 3 generation of binary (or binary coded decimals) of virtually any size. Thus, while many different embodiments of the above-described invention could be made without departing from the scope thereof, it is intended that the above-description not be taken in the limiting sense, but be interpreted as illustrative of a best mode for a particular application as developed by the invention.

What is claimed is:

1. A modular modulo 3 module having a plurality of input terminals for receiving in parallel binary coded numerical data and a plurality of output terminals for outputting the modulo 3 residue of received data, said modulo 3 module comprising:

a plurality of modular first means, each first means therein having a first and a second input line for receiving data binary coded data designable $X_0$ and $X_1$ and a first, second, third and fourth line for individually outputting $Y_0$, $\overline{Y_0}$, $Y_1$ and $\overline{Y_1}$ wherein $Y_1 = X_1 \overline{X_0}$ and $Y_0 = \overline{X_1} X_0$;

a logrithmic array of modular second means, each second means therein having eight input lines for receiving binary coded data designable $X_0$, $\overline{X_0}$, $X_1$, $\overline{X_1}$, $X_2$, $\overline{X_2}$, $X_3$ and $X_3$ and four output lines for individually outputting $Y_0$, $\overline{Y_0}$, $Y_1$ and $\overline{Y_1}$ wherein $$Y_1 = X_2 X_0 + \overline{X_3} \overline{X_2} X_1 + X_3 \overline{X_1} \overline{X_0}$$

and $$Y_0 = X_3 \overline{X_2} \overline{X_0} + X_2 \overline{X_1} \overline{X_0} + X_3 X_1$$

connecting means for connecting said plurality of input terminals of said modular modulo 3 with the inputs of said plurality of modular first means, the outputs of said plurality of modular first means with the inputs of said logrithmic array of modular second means, and the outputs of said logrithmic array of modular second means with said plurality of output terminals of said modulo 3 module.

* * * * *